United States Patent [19]

Berkman et al.

[11] 4,242,553

[45] Dec. 30, 1980

[54] APPARATUS FOR USE IN THE PRODUCTION OF RIBBON-SHAPED CRYSTALS FROM A SILICON MELT

[76] Inventors: Robert A. Frosch, Administrator of the National Aeronautics and Space Administration, with respect to an invention of Samuel Berkman, Florham Park; Harold E. Temple, Trenton, both of N.J.

[21] Appl. No.: 938,299

[22] Filed: Aug. 31, 1978

[51] Int. Cl.³ .......................... H05B 6/30; C30B 15/16

[52] U.S. Cl. .......................... 219/10.49 R; 219/10.67; 422/246; 422/249; 156/608; 156/DIG. 96; 432/264

[58] Field of Search ............... 219/10.49, 10.43, 10.41, 219/10.57, 10.67; 156/DIG. 96, DIG. 88, 615, 608; 422/246, 249, 156; 432/262, 263, 264, 265; 13/26, 27, DIG. 1

[56] References Cited

U.S. PATENT DOCUMENTS

| | | | |
|---|---|---|---|
| 2,537,289 | 1/1951 | Van Embden | 219/10.49 |
| 3,180,917 | 4/1965 | Morrison et al. | 219/10.49 |
| 3,351,686 | 11/1967 | Gayet et al. | 219/10.43 |
| 3,431,326 | 3/1969 | Letter | 219/10.41 |
| 3,954,551 | 5/1976 | Cecil et al. | 156/DIG. 88 |
| 4,157,373 | 6/1979 | Berkman et al. | 422/246 |

OTHER PUBLICATIONS

"Basics of Induction Heating", Tudbury, 1960, vol. 1, pp. 77–80, Hollow Workpieces.

*Primary Examiner*—B. A. Reynolds
*Assistant Examiner*—Philip H. Leung
*Attorney, Agent, or Firm*—Monte F. Mott; John R. Manning

[57] ABSTRACT

An improved apparatus characterized by an R-F coil, a crucible for confining a silicon melt, and a susceptor for supporting the crucible facilitating an electrical coupling of the coil with the melt. The susceptor comprises a pair of susceptor halves of a thickness less than two skin depths, each being the mirror image of the other, disposed in mutually opposed, electrically insulated relation, while the crucible comprises a quartz body supported by the graphite susceptor, whereby the R-F coil is electrically coupled with the melt.

4 Claims, 4 Drawing Figures

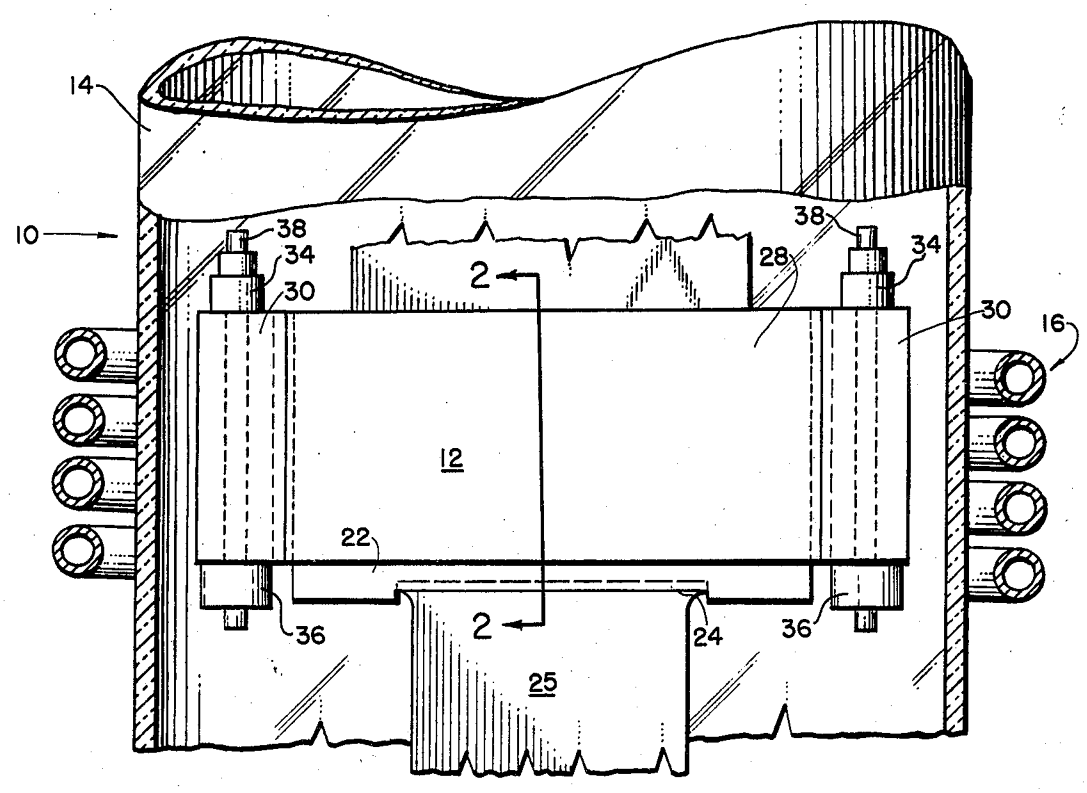
F/G. 1
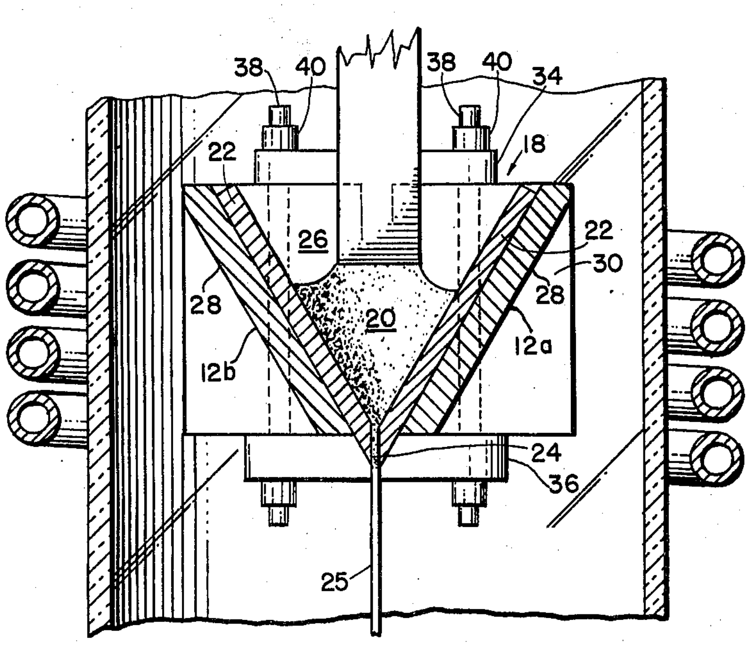
F/G. 2

APPARATUS FOR USE IN THE PRODUCTION OF RIBBON-SHAPED CRYSTALS FROM A SILICON MELT

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 U.S.C. 2457).

BACKGROUND OF THE INVENTION

1. Field of the Invention

The invention generally relates to an apparatus employed in the production of ribbon-shaped crystals and more particularly to an improved susceptor for facilitating induction heating of silicon melt.

2. Description of the Prior Art

The prior art is, of course, replete with devices adapted to be employed in the production of semi-conductor ribbon, such as silicon ribbon, suited for use in the production of solar cells.

For example, one known process for producing silicon ribbons employs a V-shaped longitudinal trough having an inner wall forming a die for confining silicon melt. The die is provided with a longitudinal slit at the lower end of the V-trough through which a slit of ribbon is pulled. This device comprises a shaping guide including a pair of plates arranged in a V-trough configuration and supported by a one-piece susceptor formed of graphite and heated by induction heating coils efficiently coupled with the susceptor to induce a heating of the susceptor.

While a small heating current incidentally may be established in the melt, by the R-F coil aforementioned, it has been found that the susceptor wall is maintained at a temperature greater than the temperature of the melt. For example, it has been determined that for a silicon melt having a melting point of 1420° C., the average temperature of the susceptor wall is 50° C. to 200° C. hotter than the melt. This fact, it is believed, clearly supports the contention that the susceptor is heated by induced heating currents and that the melt is heated by the susceptor through conduction.

Such, of course, requires that the wall of the susceptor be heated to a temperature well above that at which the melt is required to be heated. As a consequence, excessive energy is consumed in the process.

It is, therefore, the general purpose of the instant invention to provide an improved apparatus which facilitates a direct coupling of an R-F coil with a silicon melt, whereby simplicity in construction, enhanced control of thermal gradients, and a conservation of input energy are realized.

OBJECTS AND SUMMARY OF THE INVENTION

It is, therefore, an object of the invention to provide an improved device which facilitates an electrical coupling of an induction heating coil with the melt in a process for producing ribbon-shaped crystals.

It is another object to provide in an apparatus for use in the pulling of ribbon-shaped crystals an improved susceptor including a quartz crucible which is easier to fabricate, economical, and simple to employ.

These and other objects and advantages are achieved through the use of a graphite susceptor supporting quartz die plates forming a crucible of a V-trough configuration, including a pair of susceptor halves, each being the mirror image of the other, disposed in opposed, electrically insulated relation as will hereinafter become more readily apparent by reference to the following description and claims in light of the accompanying drawings.

BRIEF DESCRIPTION OF THE DRAWINGS

FIG. 1 is a fragmented side elevational view of an apparatus which embodies the principles of the instant invention.

FIG. 2 is a cross sectional view taken generally along line 2—2 of FIG. 1.

DESCRIPTION OF THE PREFERRED EMBODIMENT

Figure 3:
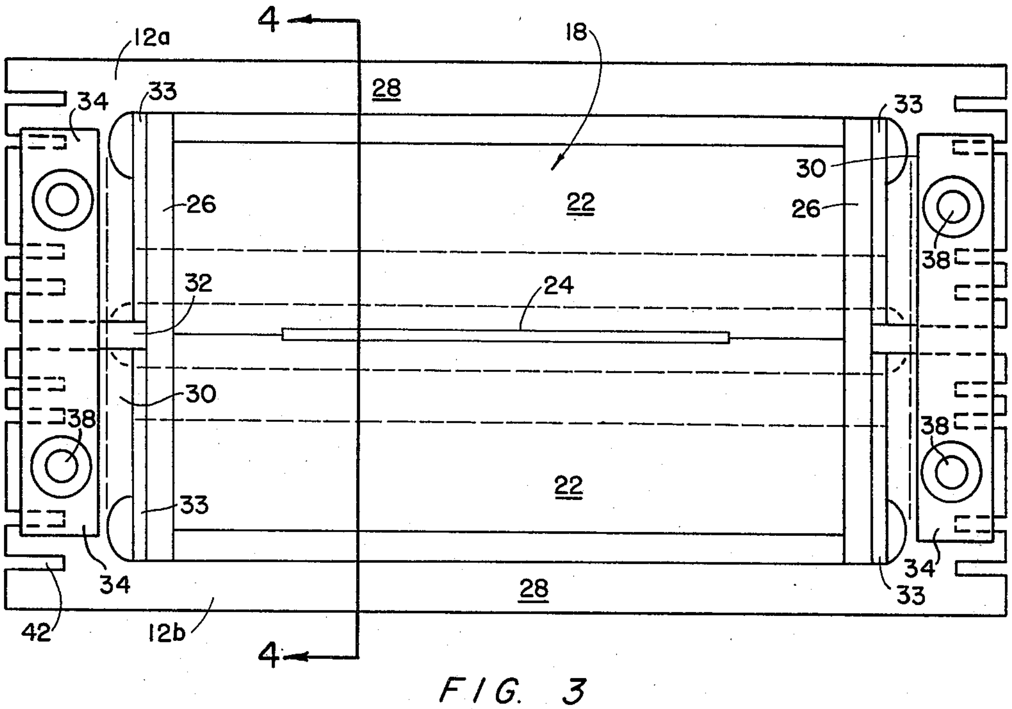
FIG. 3 is a top plan view of the apparatus shown in FIGS. 1 and 2.
Figure 4:
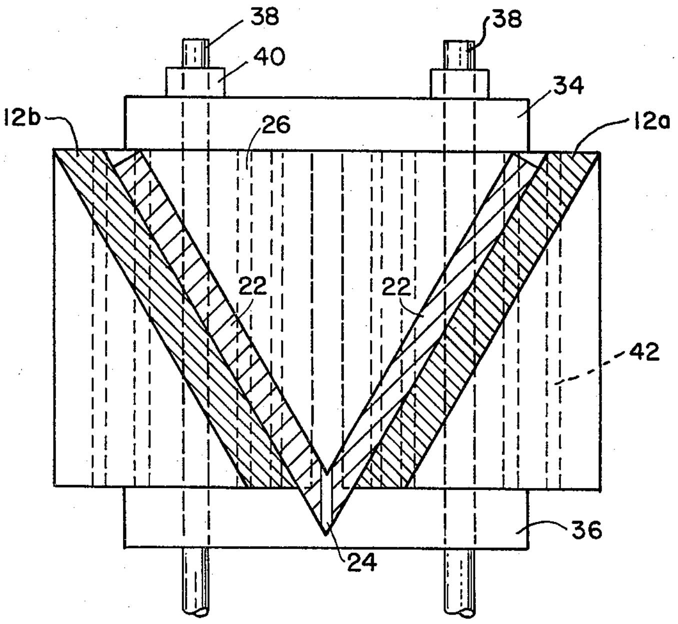
FIG. 4 is a cross sectional view taken generally along line 4—4 of FIG. 3.

Referring now to the drawings wherein like reference characters designate like or corresponding parts throughout the several views, there is shown in FIG. 1 an apparatus, generally designated 10 which embodies the principles of the instant invention. The apparatus 10 includes an improved susceptor 12 including a pair of susceptor halves, designated 12*a* and 12*b*.

As shown, the susceptor 12 is received within a cylindrical envelope 14 formed of a suitable material. It will be appreciated, of course, that the configuration of the envelope 14 is varied as desired. Disposed in circumscribing relation with the envelope 14 there is an R-F coil 16 coupled with a suitable source of power. Since R-F coils and their functions are well known, a detailed description of the coil 16 is omitted in the interest of brevity. However, it is to be understood that the coil serves to heat nominally electrical conductive material through currents induced by a varying electro magnetic field. These induced currents often are referred to as eddy currents.

The susceptor 12, in practice, serves to support a crucible 18 for a body of melt 20, FIG. 2. The crucible 18 in effect forms a lining for the susceptor. While the crucible preferably is formed of quartz having a plate glass finish, it is important to understand that other non-electrical conducting materials including silicon nitride, mulite and aluminum oxide will suffice. It is important to note that the crucible includes side plates 22 supported in downwardly converging planes, preferably at an angle of approximately 30° with respect to the vertical whereby the crucible is caused to assume a V-trough configuration.

The lowermost edge or apex of the crucible 18 is provided with an elongated slot defining a die 24. The die 24, in practice, is formed by forming in each of the plates 22 a recess which extends along an edge portion thereof. Each recess is positioned to form a mirror image of the other. Since such dies are well known, a more detailed description of the die 24 is omitted in the interest of brevity. It suffices to understand that the die 24 comprises an elongated slot extending along the lowermost edge or apex portion of the crucible 18 and that the die facilitates a discharge of the melt from the crucible as a ribbon-shaped crystal 25 is pulled downwardly from the melt.

As a practical matter, it is important to note that the crucible 18 also includes a pair of mutually spaced end plates, designated 26. The purpose of the end plates is to define opposite ends for the crucible 18. In practice, the plates 26 also are formed of quartz and are configured to assume an inverted triangular configuration.

In view of the foregoing, it can now be appreciated that the crucible 18 is of a generally V-shaped configuration, preferably is formed of quartz, and serves to confine therein an electrical conducting melt, such as a silicon melt, to be heated by the R-F coil 16.

Some electrical conducting crucible side plates 22 can be used with non-electrical end plates 26. For example, vitreous carbon crucible die plates 22 coated with CVD silicon nitride have been successfully tested with end plates 26 constructed of quartz. The quartz end plates 26 provide electrical isolation of the two conducting side plates 22. In this manner, each side plate 22 becomes an electrical part of 12*a* or 12*b* and is thus slab heated. The combination of slab heated parts is subject to the same electrical design rules for inefficient slab heating as 12*a* and 12*b* alone. Hence by suitable choice of materials and dimensions, the melt 20 of an electrical conducting material like silicon can be efficiently heated directly by induction heating.

It is here noted that each of the susceptor halves, designated 12*a* and 12*b*, includes a side plate 28 of a substantially planar configuration, and a pair of end plates 30. The end plates 30 are normally related to the plane of their respective side plates and are disposed at each of its opposite ends. It is important, also, to note that between the susceptor halves 12*a* and 12*b* there is provided a longitudinal air gap 32. The air gap is bisected by a bisecting plane passing vertically through the center of the die 24. The gap 32, as a practical matter, serves to electrically insulate each of the susceptor halves from the other for thus interrupting paths for heating currents established therein by the R-F coil.

Each of the end plates 26 is supported in a fixed relationship with the side plates 22 of the crucible by a pair of graphite shims 33. These shims are provided for assuring that a snug fit is established between the plates 22 and 26. The shims 33 of each pair also are separated by an air-gap approximating the transverse dimension of the air gap 32. Thus, the shims 33, at each of the opposite ends of the susceptor also are supported in a mutually insulated relationship.

In practice, the susceptor halves 12*a* and 12*b* of the susceptor are interconnected by a pair of vertically spaced strap plates 34 and 36. These plates extend along the upper and lower edge surfaces of the end plates 30 while a pair of vertically oriented pins 38, formed of any suitable material, preferably sapphire, and extend through the end plate 30 and pass through the strap plates 34 and 36 in place. While the pins 38 are, in practice, fabricated from sapphire other materials such as graphite may be employed. Further, the strap plates are fabricated from suitable electrical insulated materials such as sapphire, quartz or other ceramic.

As will be appreciated by those familiar with the so-called slab heating technique, the frequency at which an R-F coil is operated determines skin depth characteristics of the coil, or the depth of current penetration. For an efficient heating of a work piece it is necessary for the thickness thereof to be sufficient to permit a doubling-over of the current path. In the event the thickness of the work piece is not at least two skin depths, a doubling-over of the current paths is precluded so that current paths through the work piece thus are interrupted and rendered incomplete, whereupon a current cancelling effect is experienced with an attendent inefficient coupling of the R-F coil and work piece.

The particular frequency at which the R-F coil 16 is operated is determined by the thickness of the plate forming the susceptor 12. The frequency may be calculated, in a known manner, or established imperically, if so desired, in order to achieve a desired inefficient coupling of the coil 16 with the susceptor, so that a more efficient coupling of the coil 16 with the melt is thus achieved whereby a direct heating of the melt by the coil 16 is facilitated. Finally, it is noted that the end plates 30 are provided with a plurality of slots 42 of a depth such that the effective thickness of the end plates is less than two skin depths whereby a doubling-over of the current paths therethrough is thus avoided.

With the apparatus 10 assembled in the manner hereinbefore described, it is possible to electrically couple the coil 16 with the melt confined in the crucible 18 so that eddy currents are established in principally the melt as well as incidently in the susceptor. This, of course, constitutes a reversal of the phenomena experienced when induction heating techniques of the prior art are relied upon for heating silicon melt. As a consequence of the coupling of the coil 16 with the melt, it is possible to attain a higher average temperature for the melt than that attained for the susceptor walls. Hence, the molten silicon or melt 20 is caused to serve as a primary source of heat and, as a result, important thermal gradients are easier to control and the input energy to the system is conserved.

It should readily be apparent that the improved apparatus embodying the principles of the instant invention provides a practical solution to the problem of how to maintain a susceptor at lower temperatures than the melt contained therein when utilizing R-F coils as a source of energy.

What is claimed is:

1. In an apparatus for use in the pulling of ribbon-shaped crystals downwardly through a die set defined between a pair of quartz plates disposed in downwardly converging planes for forming an elongated, V-shaped crucible containing an electrical conductive melt, means for coupling induction heating energy to the melt comprising:

A. susceptor supporting said crucible including a pair of susceptor halves having a pair of side plates disposed in mutually spaced opposed relation, each of said side plates being substantially planar in shape and formed of an electrically conductive material, said pair of plates being downwardly inclined toward each other and having an electrically insulative air-gap defined therebetween throughout the length thereof for electrically isolating the side plates, each from the other, and a pair of end plates integrally related with each side plate and disposed in a pair of planes normally related to the plane of the side plate, each end plate being characterized by a plurality of slots extended across one face thereof, whereby the effective thickness thereof is reduced; and B. means for effecting an induction heating of the electrical conductive melt comprising an R-F coil concentrically related to the susceptor and electrically coupled with the melt, said R-F coil being characterized by an operational frequency such that the thickness of the side plates and the effective thickness of the end plates is less than two skin depths for the operational frequency.

2. In the apparatus of claim 1 wherein the crucible further includes a pair of mutually spaced end plates of inverted triangular configurations, formed of quartz and extended transversely between the side plates of said susceptor halves, and wherein the improved susceptor further comprises a pair of shims comprising graphite plates interposed between each end plate of the crucible and an end plate of a susceptor half, the shims at each of the opposite ends of said crucible being mutually spaced for defining therebetween an electrically insulative airgap.

3. The improved susceptor of claim 2 further comprising:

a pair of strap plates formed of non-conductive material extended between adjacent ends of the susceptor halves and affixed thereto for uniting said susceptor halves in an integrated configuration.

4. In an apparatus for use in the production of ribbon-shaped crystals from a silicon melt characterized by a crucible of a V-trough configuration including a pair of plates formed of an electrically non-conductive material disposed in downwardly converging planes, each plate being provided with a recess comprising a mirror image of the other for defining between the plates an inverted die, and heating means including an R-F coil concentrically related to the crucible and characterized by a known operational frequency, the improvement comprising:

A. means for electrically coupling the R-F coil with the melt comprising a susceptor supporting said crucible including a pair of electrically conductive susceptor halves disposed in mutually electrically insulated relation, whereby electrical paths between the halves is interrupted, each susceptor half comprising a side plate and a pair of end plates normally related to the side plates, each of said side plates being characterized by a thickness less than that required to sustain a doubling-over of current paths through the side plate at the operational frequency of said R-F coil, whereby current paths established in said side plates are completed through the melt.

* * * * *